United States Patent
Cox

(10) Patent No.: US 9,472,434 B2
(45) Date of Patent: Oct. 18, 2016

(54) LOCALLY HEATED MULTI-ZONE SUBSTRATE SUPPORT

(71) Applicant: Applied Materials, Inc., Santa Clara, CA (US)

(72) Inventor: Michael S. Cox, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 211 days.

(21) Appl. No.: 14/452,801

(22) Filed: Aug. 6, 2014

(65) Prior Publication Data

US 2015/0043123 A1   Feb. 12, 2015

Related U.S. Application Data

(60) Provisional application No. 61/862,866, filed on Aug. 6, 2013.

(51) Int. Cl.
*H01T 23/00* (2006.01)
*H01L 21/683* (2006.01)
*H01L 21/67* (2006.01)

(52) U.S. Cl.
CPC ..... *H01L 21/6833* (2013.01); *H01L 21/67103* (2013.01); *H01L 21/67248* (2013.01); *H01L 21/6831* (2013.01); *Y10T 29/49083* (2015.01)

(58) Field of Classification Search
CPC .................................. H01L 21/6833
USPC ........................................ 361/234
See application file for complete search history.

(56) References Cited

U.S. PATENT DOCUMENTS

| | | | |
|---|---|---|---|
| 4,751,609 A | 6/1988 | Kasahara | |
| 5,595,241 A * | 1/1997 | Jelinek | H01L 21/68785 118/725 |
| 5,646,814 A | 7/1997 | Shamouilian et al. | |
| 5,671,116 A | 9/1997 | Husain | |
| 5,846,375 A * | 12/1998 | Gilchrist | H01J 37/32724 118/723 E |
| 6,055,150 A | 4/2000 | Clinton et al. | |
| 6,120,661 A | 9/2000 | Hirano et al. | |
| 6,768,627 B1 | 7/2004 | Kitabayashi et al. | |
| 6,770,852 B1 * | 8/2004 | Steger | F27B 5/14 118/50.1 |
| 7,667,944 B2 | 2/2010 | Naim | |
| 8,320,099 B2 | 11/2012 | Hirahara et al. | |
| 2009/0284894 A1 | 11/2009 | Cooke | |
| 2012/0033340 A1 | 2/2012 | Roy et al. | |
| 2012/0115254 A1 | 5/2012 | Singh | |
| 2012/0307412 A1 | 12/2012 | Boyd, Jr. et al. | |
| 2013/0001899 A1 | 1/2013 | Hwang et al. | |
| 2013/0088809 A1 | 4/2013 | Parkhe et al. | |

FOREIGN PATENT DOCUMENTS

| | | |
|---|---|---|
| JP | 07-106317 | 4/1995 |
| JP | 04237148 B2 | 3/2009 |

OTHER PUBLICATIONS

International Search Report and Written Opinion for International Application No. PCT/US2014/048182 dated Nov. 17, 2014.

\* cited by examiner

*Primary Examiner* — Stephen W Jackson
(74) *Attorney, Agent, or Firm* — Patterson & Sheridan, LLP

(57) ABSTRACT

Embodiments of the present disclosure provide an electrostatic chuck (ESC) having azimuthal temperature control. In one embodiment, the electrostatic chuck includes an insulating base, a dielectric layer disposed on the insulating base, the dielectric layer having a substrate supporting surface, an electrode assembly disposed between the insulating base and the substrate supporting surface, and a plurality of heating elements coupled to the insulating base, the heating elements azimuthally control a temperature profile across a substrate surface.

16 Claims, 9 Drawing Sheets

LOCALLY HEATED MULTI-ZONE SUBSTRATE SUPPORT

CROSS-REFERENCE TO RELATED APPLICATIONS

This application claims benefit of U.S. provisional patent application Ser. No. 61/862,866, filed Aug. 6, 2013, which is herein incorporated by reference.

BACKGROUND

1. Field

Embodiments of the disclosure generally relate to a substrate support assembly for use in a plasma processing chamber, more specifically, to an electrostatic chuck having distributed heating elements to provide independent temperature control across a substrate.

2. Description of the Related Art

In the semiconductor and other industries, electrostatic chucks (ESC) are used to hold workpiece such as substrates on supports during processing of the substrate. A typical ESC may include a base, an electrically insulative layer disposed on the base, and one or more electrodes embedded in the electrically insulative layer. The ESC may be provided with an embedded electric heater, as well as be fluidly coupled to a source of heat transfer gas for controlling substrate temperature during processing. During use, the ESC is secured to the support in a process chamber. The electrode in the ESC is electrically biased with respect to a substrate disposed on the ESC by an electrical voltage source. Opposing electrostatic charges accumulate in the electrode of the ESC and on the surface of the substrate, the insulative layer precluding flow of charge therebetween. The electrostatic force resulting from the accumulation of electrostatic charge holds the substrate to the ESC during processing of the substrate.

ESCs have been developed with multiple concentric heating zones to improve processing results. The heating zones provide a means for edge to center temperature control ability to equalize reaction rates or other properties of the substrate or film because many chemical reactions performed on the workpiece, such as the etching of substrates, are highly dependent on temperature. Precisely etching a substrate within a plasma chamber can be challenging because the plasma within the chamber, pumping other chamber asymmetries may cause the temperature across the substrate to be azimuthally non-uniform. An azimuthal temperature gradient may exist asymmetrically across the substrate such that one region of the substrate is at a different temperature compared to another region of the substrate. When the temperature of the substrate is not uniform, features may not be uniformly etched into the various layers disposed on the substrate.

However, it has been difficult or prohibitively expensive for conventional ESCs to have more than a few concentric zones of temperature control across the diameter of the substrate. The inability to control substrate azimuthal temperature uniformity has an adverse effect on process uniformity both in a single substrate and between substrates.

Therefore, there is a need in the art for an improved ESC assembly that provides multiple zones of temperature control.

SUMMARY OF THE DISCLOSURE

Embodiments of the present disclosure provide an electrostatic chuck (ESC) having multiple zones of temperature control. In one embodiment, an ESC includes an insulating base, an electrode assembly disposed on the insulating base, a plurality of independently controllable heating elements coupled to the insulating base, the heating elements arranged to provide azimuthal temperature control, and a dielectric member coupled to the base and forming a substrate support surface of the ESC.

In another embodiment, the ESC includes an insulating base, a dielectric layer disposed on the insulating base, the dielectric layer having a substrate supporting surface, an electrode assembly disposed between the insulating base and the substrate supporting surface, and a plurality of heating elements configured to azimuthally control a temperature profile across a substrate surface In yet another embodiment, an electrostatic chuck includes an insulating base having a first surface and a second surface opposing the first surface, an electrode assembly formed on the first surface of the insulating base, the electrode assembly has a first electrode interleaved with a second electrode, a plurality of heating elements formed between interleaved portions of the first and second electrodes, and an encapsulating member coupled to the electrode assembly.

In another embodiment, a method for fabricating an ESC includes forming an electrode assembly on an insulating base, wherein the electrode assembly includes a first electrode interleaved with a second electrode, forming a plurality of heating elements on the insulating base, the heating elements configured to azimuthally control a temperature profile across a substrate surface, and forming an encapsulating member on the electrode assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

Figure 1A:
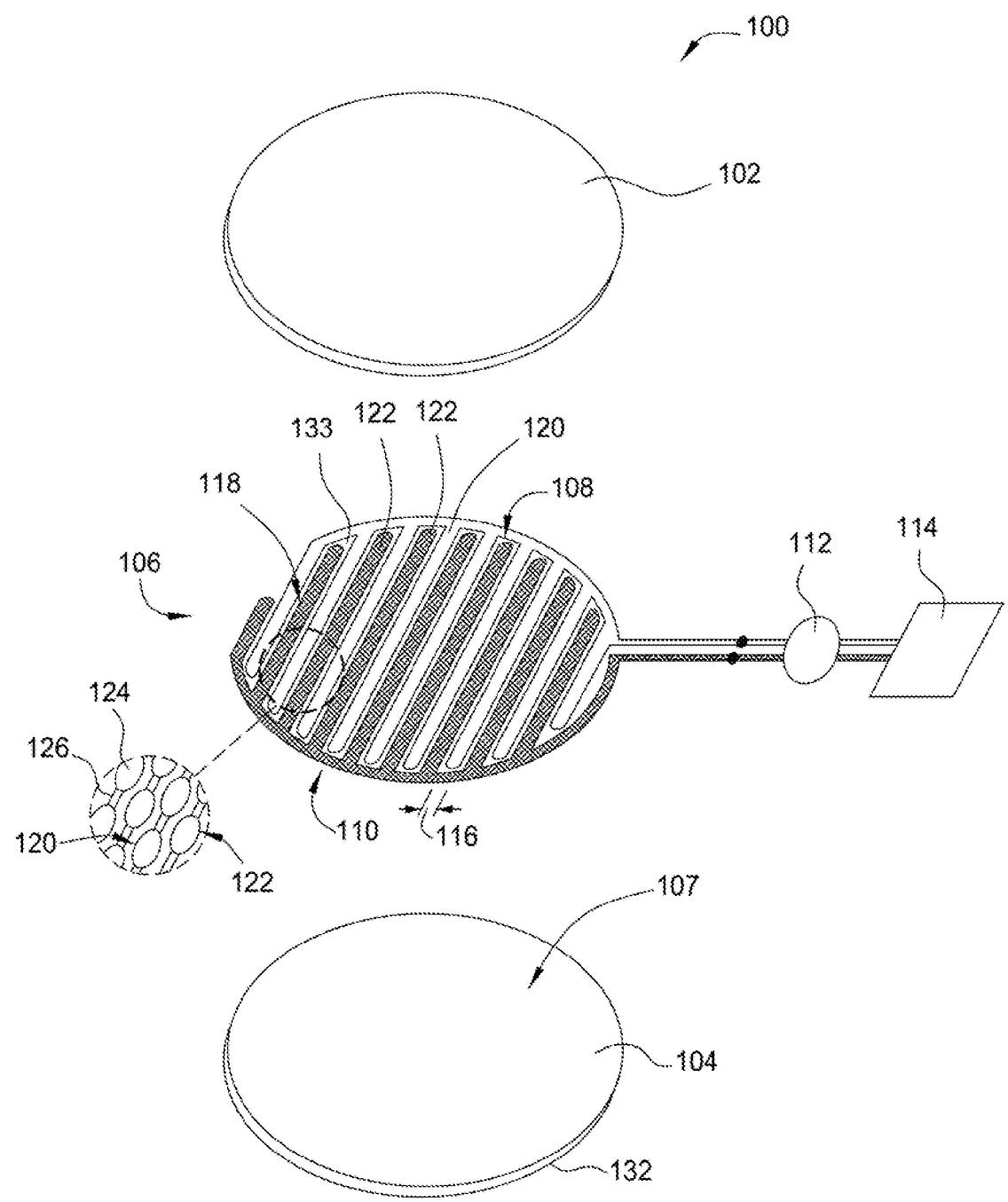
FIG. 1A depicts an exploded view of an electrostatic chuck (ESC) according to one embodiment of the disclosure.

It is to be noted, however, that the appended drawings illustrate only typical embodiments of this disclosure and are therefore not to be considered limiting of its scope, for the disclosure may admit to other equally effective embodiments. To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Embodiments of the present disclosure provide an electrostatic chuck (ESC) having azimuthal temperature control. The ESC includes a plurality of heating elements which is independently controllable and distributed across the ESC in a manner that enables azimuthal temperature control. In another embodiment, a plurality of heating elements is driven inductively, thereby minimizing the amount of holes required in the ESC to route power to the heating elements. In other embodiments, the heating elements may be resistive heaters.

FIG. 1A depicts an exploded view of an electrostatic chuck 100 according to one embodiment of the disclosure. The electrostatic chuck 100 may be used in any suitable plasma process, including physical vapor deposition (PVD) process, chemical vapor deposition (CVD) process, etching process, or any suitable plasma or vacuum process. The electrostatic chuck 100 may also be adapted for use in non-plasma and non-vacuum environments, particularly for high temperature applications. Although one embodiment of an electrostatic chuck 100 is disposed herein, it is contemplated that electrostatic chucks from any manufacturers may be adapted to benefit from the disclosure.

The electrostatic chuck 100 generally includes an insulating base 104, an electrode assembly 106 disposed on a upper surface 107 of the insulating base 104, and an encapsulating member 102 disposed on the electrode assembly 106. The insulating base 104 may have any suitable shapes selected for handling a specific workpiece. In the illustrative example depicted in FIG. 1A, the insulating base 104 has circular-like shape having a periphery 132 that substantially matches the shape and size of electrode assembly 106 and the encapsulating member 102 sequentially formed thereon to allow a substrate with similar shape and size to be disposed thereon. It is noted that the insulating base 104 may be in any shapes or configurations as needed. The insulating base 104 may be fabricated from an insulating material, such as a dielectric material or a ceramic material. Suitable examples of the ceramic materials or dielectric materials may include silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. A doped ceramic, such as titania doped alumina or calcium doped aluminum nitride or the like may also be used. Optionally, the insulating base 104 may be a metallic or semiconducting body having a dielectric layer disposed on the surface facing the electrode assembly 106.

The electrode assembly 106 disposed on the insulating base 104 includes at least two sets of distributed electrodes 108, 110. Each electrode 108, 110 may be charged with different polarities as needed when a voltage power is applied thereto, thus generating an electrostatic force. The electrodes 108, 110 may be configured to distribute the electrostatic force along a distance at least two times with width of the electrostatic chuck 100. Each electrode 108, 110 may each have a plurality of electrode fingers 120, 122 intervening with each other. It is believed that electrode interleaved fingers 120, 122 provides local electrostatic attraction distributed across a large area of the electrostatic chuck 100 in which the aggregation provides a high chucking force while using less chucking voltage. The electrode fingers 120, 122 may be formed to have different lengths and geometry. In one example, one or both of the electrode fingers 120, 122 may be formed from interconnected electrode islands 124. Interconnections 126 between electrode islands 124 may be in the plane of the electrodes 108, 110 as shown in FIG. 1A, or out of plane, such as in the form of jumpers and/or vias. In one embodiment, the electrode finger 120, 122 may have a width 116 of between about 0.1 mm and about 20 mm, for example about 0.25 mm to about 10 mm, which may vary depending upon the type of the insulating base 104 and the material type to be chucked. In some embodiments, electrode fingers 120, 122 may be configured with different sizes intervening to each other. The electrode fingers 120, 122 may be alternatively and repeatedly formed until predetermined numbers of the electrode fingers are formed.

Between each of the electrode fingers 120 of the first electrode 108, spaces 133 are defined to receive electrode fingers 122 of the second electrode 110. The spaces 133 may be an air gap, filled with a dielectric spacer material, or filled with at least one of the insulating base 104 or encapsulating member 102.

Figure 1B:
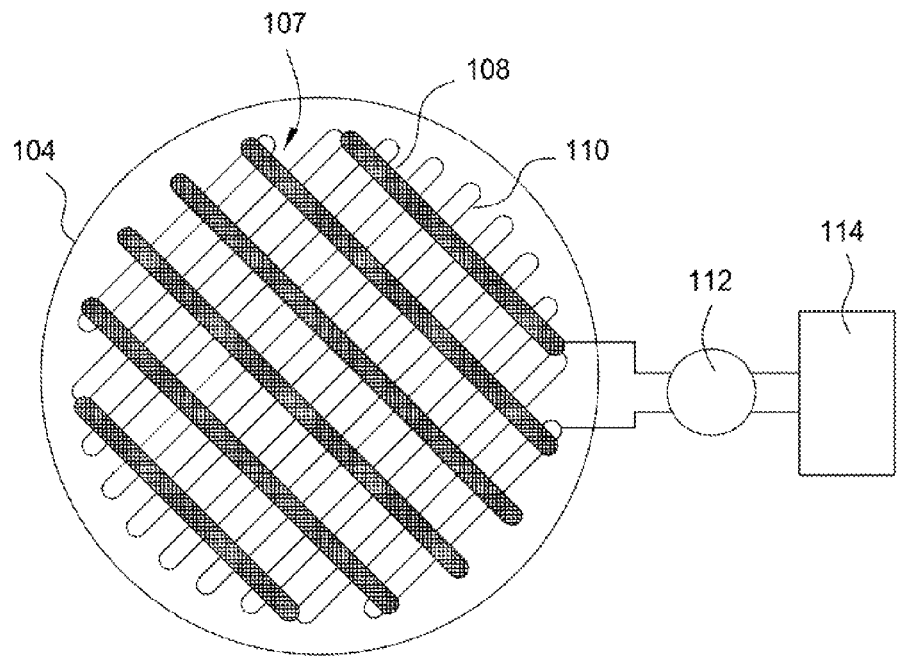
FIGS. 1B-1E depict a sectional view of various exemplary arrangements of the electrodes according to embodiments of the disclosure.
Figure 1C:
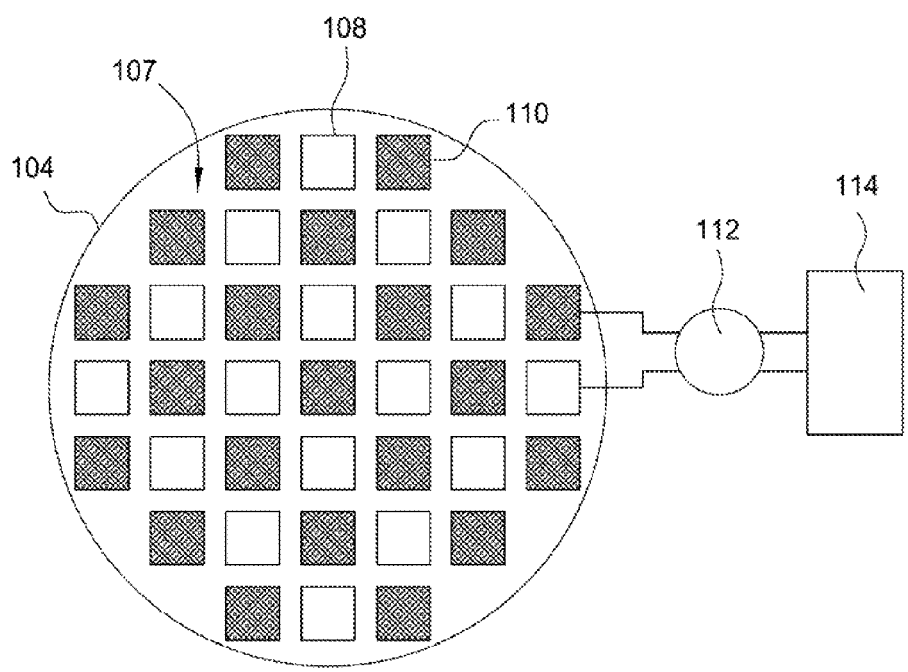
Figure 1D:
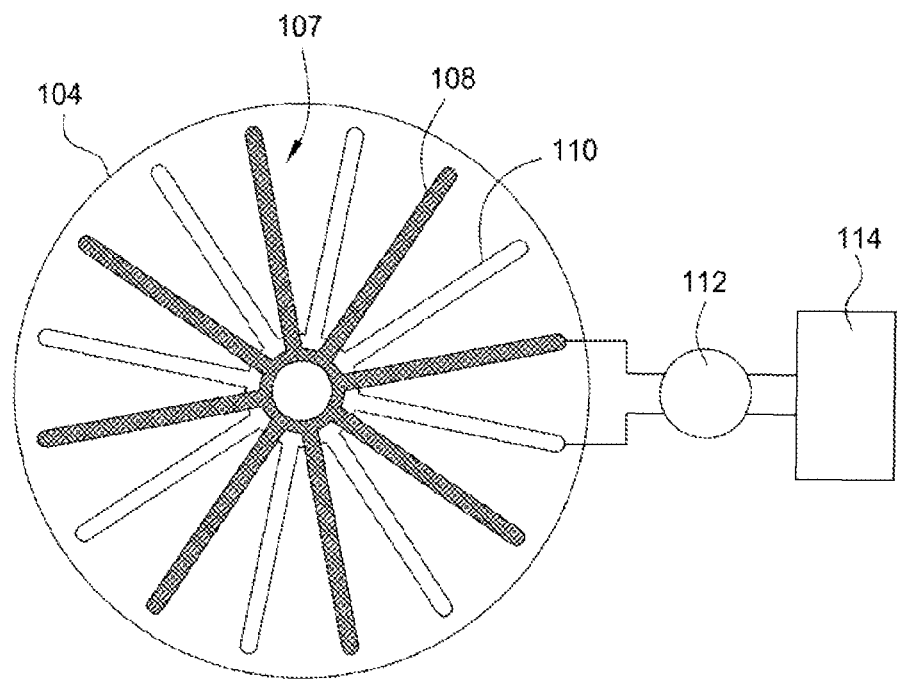
Figure 1E:
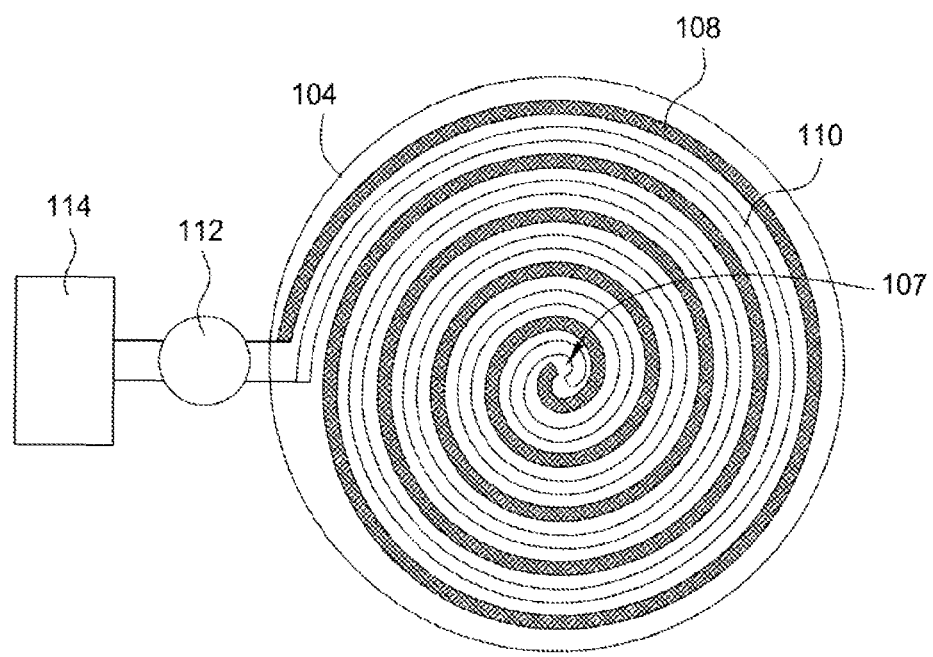

It is contemplated that the configuration of the electrodes 108, 110 shown in FIG. 1A is solely for exemplary purposes. The electrodes 108, 110 may be arranged in any configurations such that the electrodes are distributed over the upper surface 107 of the insulating base 104 with alternating polarity. The concept of having two different sets of electrodes charged with different polarities can be equally well adapted to electrodes arranged in any configurations. FIGS. 1B-1E illustrate some possible arrangements of the first and second electrodes. FIG. 1B depicts a grid-like electrode configuration where the first electrode 108 intersects the second electrode 110 to form a contiguous array of electrode assembly. The first and second electrodes 108, 110 may be positioned coplanar or in different planes parallel to each other. FIG. 1C depicts a pixel-like or dot-like electrode configuration where the first electrode 108 and second electrode 110 are arranged (either coplanar or in different planes) such that any two adjacent electrodes in a row or column have opposite polarities. In one example as shown, the first and second electrodes 108, 110 are arranged in a grid array. It is contemplated that the first and second electrodes 108, 110 may be arranged in a rectangular array, a hexagonal array, a honeycomb array, or in a symmetrical pattern. FIG. 1D depicts another configuration of electrodes where the first and second electrodes 108, 110 are alternatingly arranged in a polar array about a central axis. FIG. 1E depicts yet another configuration of electrodes where the first and second electrodes 108, 110 are alternatingly arranged in a substantially concentric pattern.

A power source 114 is coupled to the first and the second electrodes 108, 110 through a power switch 112. The power source 114 is configured to provide a voltage power to the first and the second electrode 108, 110 to generate charges with different polarities, either positive or negative charges. The positive or negative charges generated from the first and the second electrode 108, 110 provide an electrostatic force to attract a substrate disposed in the electrostatic chuck 100 in a secured position. In one embodiment, the power source 114 may be configured to provide a DC or AC power to the first and the second electrodes 108, 110. In another embodiment, the power source 114 may be configured to provide RF power which couples capacitively to the electrodes 108, 110 to apply RF bias to the substrate.

The encapsulating member 102 is disposed on the insulating base 104, sandwiching the electrode assembly 106, to form an electrostatic chuck 100 as a unitary structure. The encapsulating member 102 is positioned on the electrode assembly 106 to provide an insulating surface on which the substrate is chucked. The encapsulating member 102 may be fabricated by a material having thermal properties, e.g., coefficient of thermal expansion, substantially matching that of the underlying electrode assembly 106, and in some embodiments, also the insulating base 104.

After the encapsulating member 102, the electrode assembly 106 and the insulating base 104 are stacked in a predetermined order, a bonding process, such as an annealing process, is performed to fuse the encapsulating member 102, the electrode assembly 106 and the insulating base 104 together, forming a laminated structure of the electrostatic chuck 100 as an integral part. As the encapsulating member 102, the electrode assembly 106 and the insulating base 104 may be required to operate in a high temperature environment, e.g., greater than 300 degrees Celsius, the materials utilized to fabricate these three components may be selected from heat resistance materials, such as ceramic materials or glass materials, that can sustain high thermal treatment during the heat process.

In one embodiment, the encapsulating member 102 and the insulating base 104 may be fabricated from a ceramic material, a glass material, or a composite of ceramic and metal material, providing good strength and durability as well as heat transfer properties. The materials selected to fabricate the encapsulating member 102 and the insulating base 104 may have a coefficient of thermal expansion that is substantially matched or similar to the intermediate electrode assembly 106 to reduce thermal expansion mismatch, which may cause stress or failure under high thermal loads. In one embodiment, the coefficient of thermal expansion of the encapsulating member 102 may be between about 3 and about 8 um/(m*K). The ceramic material suitable for fabricating the encapsulating member 102 and the insulating base 104 may include, but not limited to, glass, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 102 and the insulating base 104 may be fabricated from a composite material including a different composition of a ceramic and metal, such as metal having dispersed ceramic particles.

In one embodiment, the electrode assembly 106 may be fabricated from a metallic material, for example molybdenum, which may have a coefficient of thermal expansion similar to the adjacent encapsulating member 102 and the insulating base 104. In one embodiment, the coefficient of thermal expansion of the electrode assembly 106 is between about 2 and about 8 um/(m*K), and is generally within 20 percent of the coefficient of thermal expansion of the encapsulating member 102.

During operation, a negative charge may be applied to the first electrode 108 and a positive charge may be applied to the second electrode 110, or vise versa, to generate an electrostatic force, when a power is supplied to the power source 114. During chucking, the electrostatic force generated from the electrodes 108, 110 chucks and holds the substrate disposed thereon in a secured position. As the power supplied from the power source 114 is turned off, the charges present in the interface 118 between the electrodes 108, 110 may be maintained over a long period of time. To release the substrate held on the electrostatic chuck 100, a short pulse of power in the opposite polarity may be provided to the electrodes 108, 110 to remove the charge present in the interface 118.

Figure 2A:
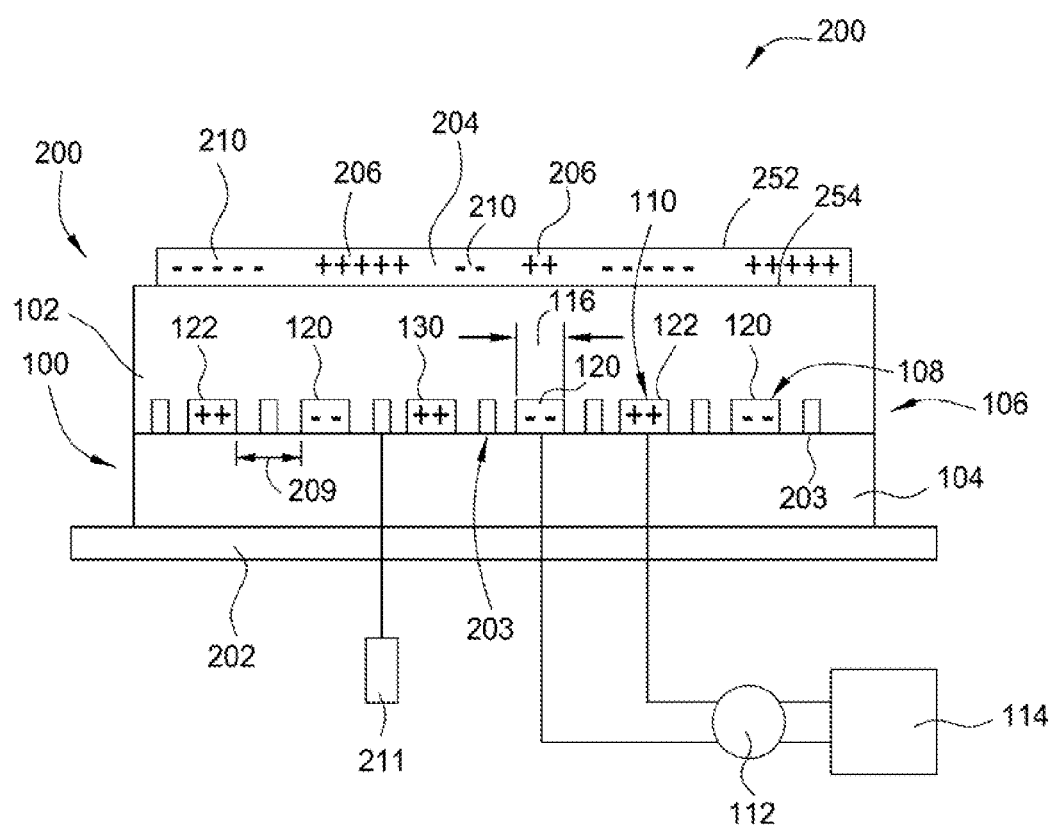
FIG. 2A depicts a sectional view of a substrate support assembly having the ESC of FIG. 1 according to another embodiment of the disclosure.

FIG. 2A depicts a sectional view of a substrate support assembly 200 having the electrostatic chuck of FIG. 1 according to another embodiment of the disclosure. The substrate support assembly 200 can then be further placed in a processing chamber, such as a plasma processing vacuum chamber, to hold a substrate 204 disposed thereon during processing. It is noted that while the substrate support assembly 200 described herein is used for vacuum plasma processing, the substrate support assembly 200 may be implemented in any suitable processing tools, including those processing equipments operating under atmosphere or any conditions.

As depicted in the cross-sectional view of FIG. 2A, the electrode assembly 106 is disposed on the insulating base 104, which is supported by a pedestal 202. The electrode assembly 106 is covered by the encapsulating member 102 and may include the first electrode 108 and the second electrode 110 with intervening electrode fingers 120, 122. In the example depicted in FIG. 2A, a negative charge is applied to the first electrode 108 and a positive charge is applied to the second electrode 110. The negative and positive charges generated from the electrode assembly 106 respectively induce the substrate 204 to generate charges with opposite polarities, i.e., positive charges and negative charges, thereby generating an electrostatic force to chuck the substrate 204 on the substrate support assembly 200. For example, negative charges present on the electrode fingers 120 of the first electrode 108 may induce the substrate 204 to locally generate positive charges 206, so as to create electrostatic force to securely position the substrate 204 on the substrate support assembly 200. Similarly, positive charges present on the electrode fingers 122 of the second electrode 110 may induce the substrate 204 to locally generate negative charges 210. It is contemplated that some of the electrode fingers from the first and second electrodes 108, 110 may be turned off or operated at a higher power than other electrode fingers during processing to flatten a bowed substrate against the electrostatic chuck 100.

By utilizing the intervening finger electrodes 120, 122 of the first and the second electrode 108, 110, an enhanced and localized electrostatic field may be created, which is distributed across a greater area of the electrostatic chuck 100 due to the long length of the interface 118 defined between the electrode fingers 120, 122, generating an electrostatic attraction to the substrate, helping to retain the substrate 204 on the substrate support assembly 200 with less chucking voltage compared to conventional electrostatic chucks.

In one embodiment of the disclosure shown in FIG. 2A, a plurality of heating elements 203 is further disposed on the upper surface of the insulating base 104. The heating elements 203 may be positioned in parallel to the electrodes 108, 110. The heating elements 203 may be in the form of discrete metal lines or spaces disposed in the space defined between the electrodes 108, 110. Each group of one or more heating elements 203 may be separately coupled to a temperature controller 211, thereby providing a plurality of independently controllable heating zones across the electrostatic chuck 100. In one example shown in FIG. 2A, the heating elements 203 are disposed along a space between two adjacent electrode fingers 120, 122. The spacing 209 between two immediate adjacent electrode fingers 120, 122 may be between about 1 mm and about 3 mm, which may vary depending upon the size of the electrode assembly 106 and/or the size of electrode fingers 120, 122.

Figure 2B:
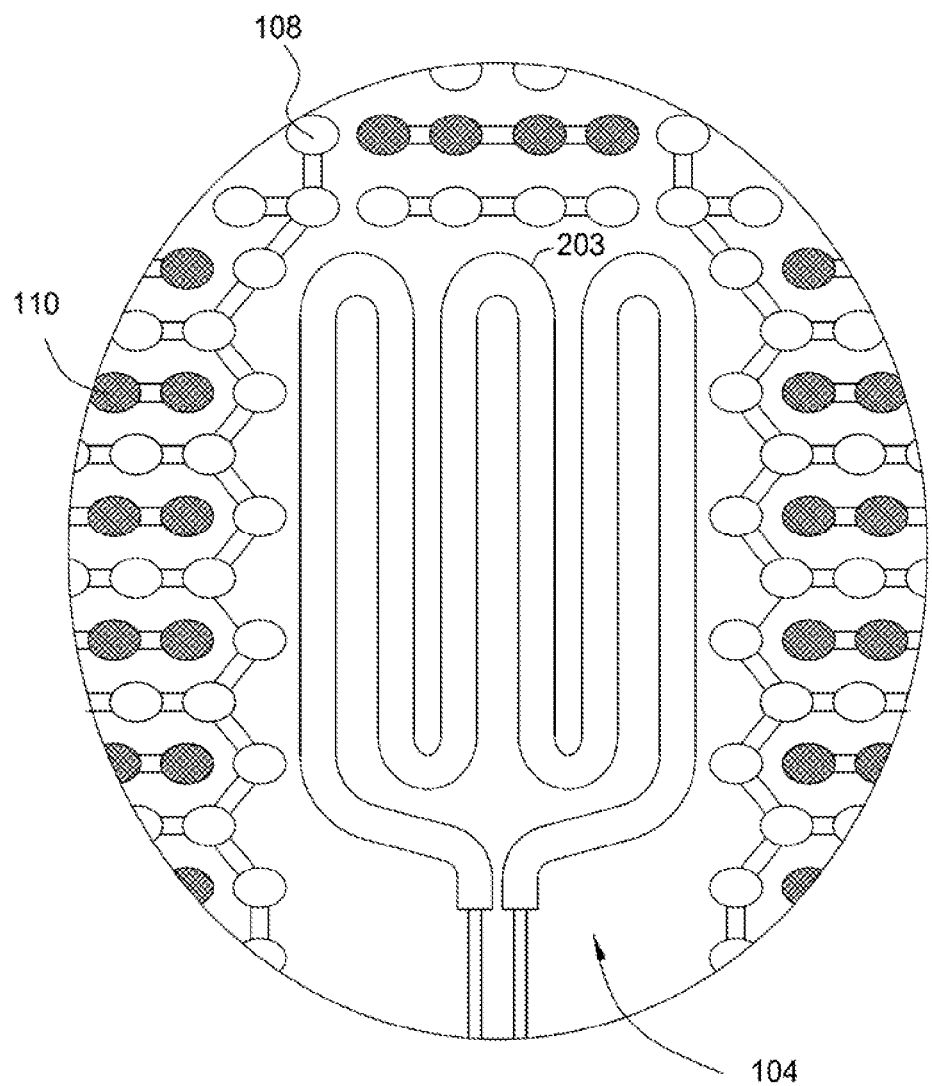
FIG. 2B depicts an enlarged top view of a portion of the insulating base showing the arrangement of the heating elements and the electrodes according to another embodiment of the disclosure.

In another embodiment of the disclosure, the heating elements 203 may be surrounded by the electrodes 108, 110 and arranged in a manner that the heating elements 203 are not in parallel with the electrodes 108, 110 to avoid diminishing the electrostatic coupling of the electrodes. For example, in one embodiment shown in FIG. 2B, which is an enlarged top view of a portion of the insulating base 104, each of the heating elements 203 may be in the form of a finger like and extended in a direction that is substantially perpendicular to the arrangement of the electrodes 108, 110. The configuration and some possible arrangement of the heating elements 203 will be discussed in more detail below with respect to FIGS. 3, 4A-4C and 5.

Figure 3:
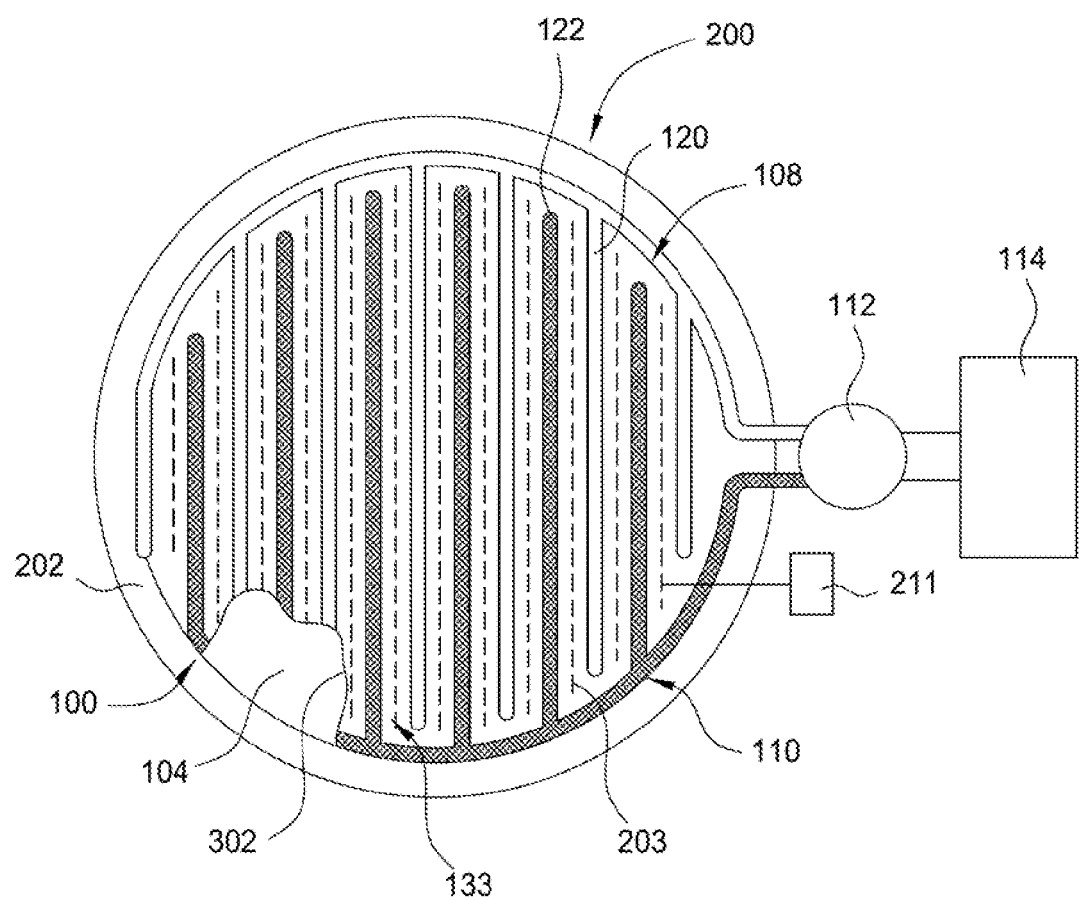
FIG. 3 depicts a schematic top view of the substrate support assembly of FIG. 2A having a portion of a layer cut away to expose the insulating base 104 according to one embodiment of the disclosure.

FIG. 3 depicts a schematic top view of the substrate support assembly 200 of FIG. 2A having a portion of a layer 302 cut away to expose the insulating base 104 according to one embodiment of the disclosure. For ease of illustrative purposes, the substrate has been omitted. FIG. 3 illustrates an exemplary arrangement of distributed, independently controlled heating elements 203 and electrode fingers 120, 122. The heating elements 203 may be any heating device that is suitable for providing inductive or resistive heating to the electrostatic chuck 100.

The first and second electrodes 108, 110 may be arranged in any configurations over the upper surface 107 of the insulating base 104 with alternating polarity, such as those shown in FIGS. 1B-1E. Correspondingly, the heating elements 203 may be interspersed with the first and second electrodes 108, 110 in any arrangement across the surface of the insulating base 104 without being physically in contact with the first and second electrodes 108, 110. Alternatively, the heating elements 203 may be disposed in a different layer than the layer having the electrodes so that the number and/or configuration of the heating elements are not limited by the surface area required for the chucking electrodes. For example, the heating elements 203 may be arranged in a grid-like configuration, a pixel-like or dot-like configuration, a polar array configuration, or a concentric configuration similar to those discussed above with respect to FIGS. 1B-1E.

Referring back to FIG. 3, the heating elements 203 may be in the form of discrete metal lines or spaces disposed in the space 133 defined between the first and second electrodes 108, 110. Each group of one or more heating elements 203 may be separately coupled to the temperature controller 211 to provide a plurality of independently controllable heating zones across the electrostatic chuck. The heating elements 203 therefore are able to independently heat the electrostatic chuck in a point-by-point controllable manner, thereby azimuthally controlling the temperature distribution across the diameter of the substrate disposed thereon.

In one example, each of the heating elements 203 is formed on the scale of about 0.1 mm to about 30 mm in width, for example about 0.5 mm, and about 0.1 mm to about 30 in length, for example about 10 mm. The heating elements 203 may have a thickness of about 0.01 mm to about 1 mm. While the heating elements 203 depicted here have about 80 heating elements, any number of heating elements is contemplated. In various examples, there may be about 10 to about 300 heating elements, such as about 100 to about 160 heating elements, arranged across the surface of the insulating base 104. The number of the heating elements 203 may vary depending upon the surface area of the electrostatic chuck 100. It should be appreciated that the only practical limitations to the number of zones of substrate heating are the amount of force needed to hold gas pressure exerted onto the backside of the substrate in the non-chucking areas (for heat exchange purposes), and the surface area that is occupied by the electrodes 108, 110 for achieving required electrostatic force in the chucking areas.

Figure 4A:
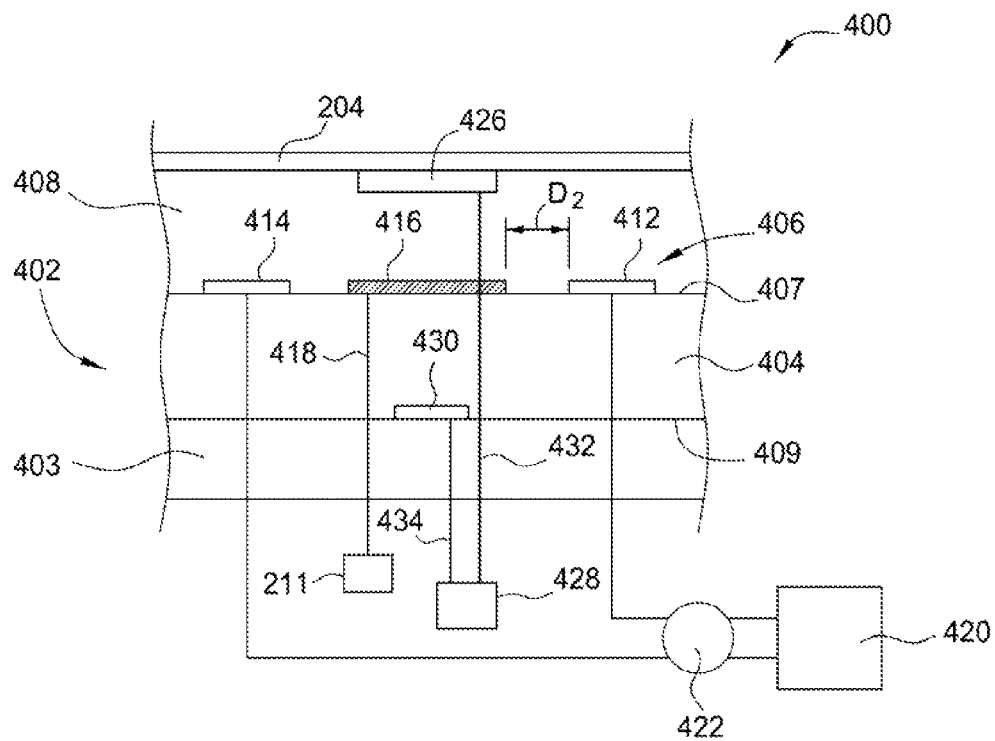
FIGS. 4A-4C depict a sectional partial view of the substrate support assembly of FIG. 2A showing various exemplary arrangements of heating elements.

FIG. 4A depicts a schematic partial cross-sectional view of a substrate support assembly 400 according to another embodiment of the disclosure. The substrate support assembly 400 shown in FIG. 4A may function in a similar way as discussed above with respect to the electrostatic chuck 100 depicted in FIGS. 1A-1E, 2A-2B, and 3. The substrate support assembly 400 includes an electrostatic chuck 402 positioned on a pedestal 403. The electrostatic chuck 402 includes an insulating base 404, a electrode assembly 406 disposed on the insulating base 404, and an encapsulating member 408 disposed on the electrode assembly 406 to hold a substrate 204 thereon during processing. The electrode assembly 406 may include a plurality of heating elements 416 (only one is shown) positioned within a space 417 defined between, or adjacent to a first electrode 412 and a second electrode 414 that is disposed parallel to the first electrode 412. The first and second electrodes 412, 414 each connects to a power source 420 via a switch 422 to provide a voltage power to the first and second electrodes 412, 414 to generate charges with different polarities.

Figure 4B:
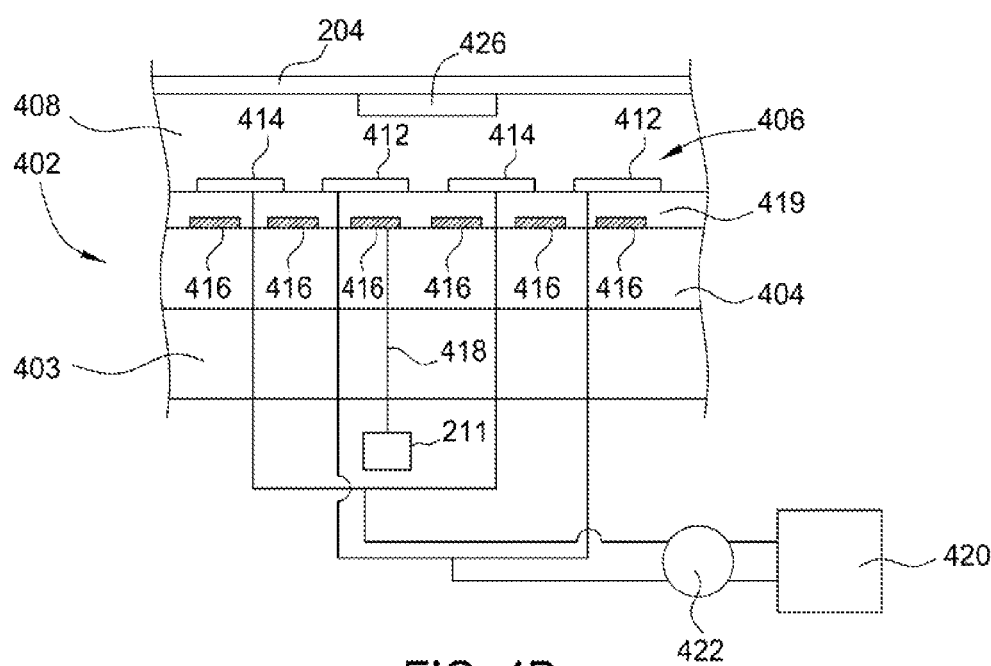

In the embodiment of FIG. 4A, the heating elements 416 may be disposed on a top surface 407 of the insulating base 404 and are coplanar with the first and second electrodes 412, 414. The heating elements 416 may be disposed in the same layer as the first and second electrodes 412, 414. Alternatively, the interleaved first and second electrodes 412, 414 may be formed in a first layer laminated to a second layer having the heating elements. For example, the interleaved first and second electrodes may be disposed directly onto a thin layer 419 having the heating elements 416 therein, as shown in FIG. 4B. In such a case, the heating elements 416 may be in the form of discrete sections or a continuous line configured in a predetermined pattern. Having the heating elements and the electrodes formed in the same layer (or two adjacent layers laminated together) may be advantageous since the thickness of the electrostatic chuck can be reduced and formed as an integrated component with low mass. The low mass enables rapid heating and cooling of the substrate support assembly 400, which is particularly useful when the heating elements 416 are configured to provide a higher temperature ramp rates of about 30° C./second or above, such as about 50° C./second to 250° C./second, for example about 100° C./second.

Figure 4C:
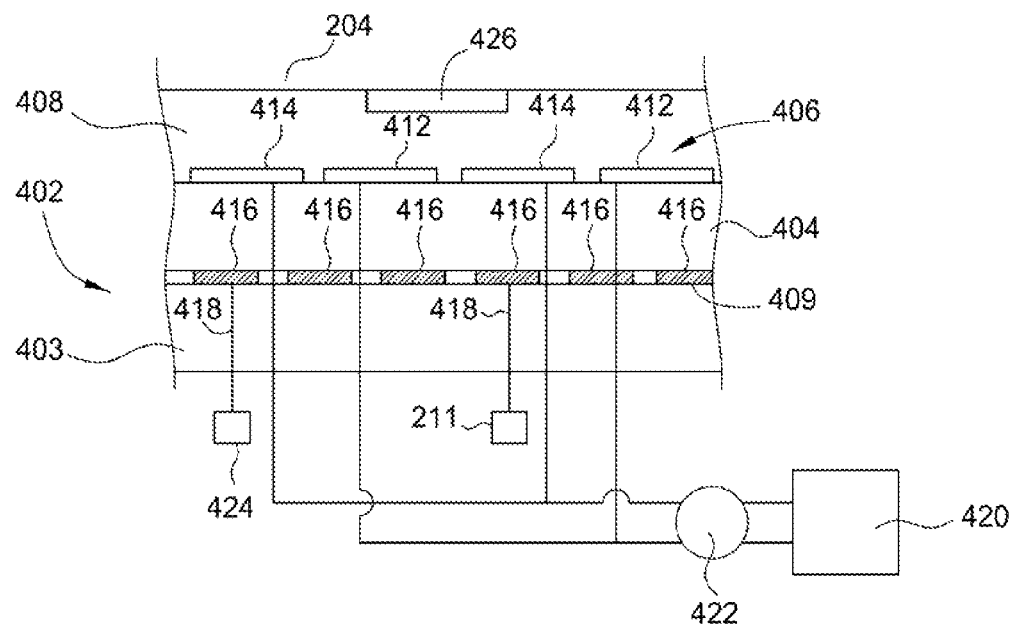

The heating elements 416 may use any suitable heating techniques, such as resistive heating or inductive heating. FIGS. 4A-4C depict embodiments where the heating elements 416 are resistive heating elements. The heating elements 416 may be composed of a resistive metal, a resistive metal alloy, or a combination of the two. Suitable materials for the heating elements may include those with high thermal resistance, such as tungsten, molybdenum, titanium, or the like. The heating elements 416 may also be fabricated with a material having thermal properties, e.g., coefficient of thermal expansion, substantially matching at least one or both the thermal properties of the encapsulating member 408 and the underlying insulating base 404 to reduce stress caused by mismatched thermal expansion.

Referring back to FIG. 4A, the heating elements 416 may be coupled to an external power source 211 through one or more electrical interconnections 418 running through the insulating base 404. The power source 424 may include a direct current (DC) power source, an alternating current (AC) power source, or a combination of both. Each of the heating elements 416 may be coupled to the same or separate one or more power sources and independently controlled so as to "tune" temperature profile on the substrate 204 during processing.

In an alternative embodiment shown in FIG. 4C, the heating elements 416 may be formed on a backside surface 409 of the insulating base 404 opposing the first and second electrodes 412, 414. Having the heating elements 416 formed on the backside of the insulating base 404 may be advantageous since it avoids the complexity of wiring electrical interconnections through the insulating base 404 required to connect the heating elements 416 to the external power source. As the heating elements 416 are formed in a different layer than the electrodes 412, 414, the heating elements 416 may be arranged in any pattern, including patterns horizontally overlap the electrodes 412, 414. Also, the number of the heating elements 416 is not limited by the surface area required for the chucking electrodes. As a result, a greater control of the temperature profile across the substrate can be obtained.

Figure 5:
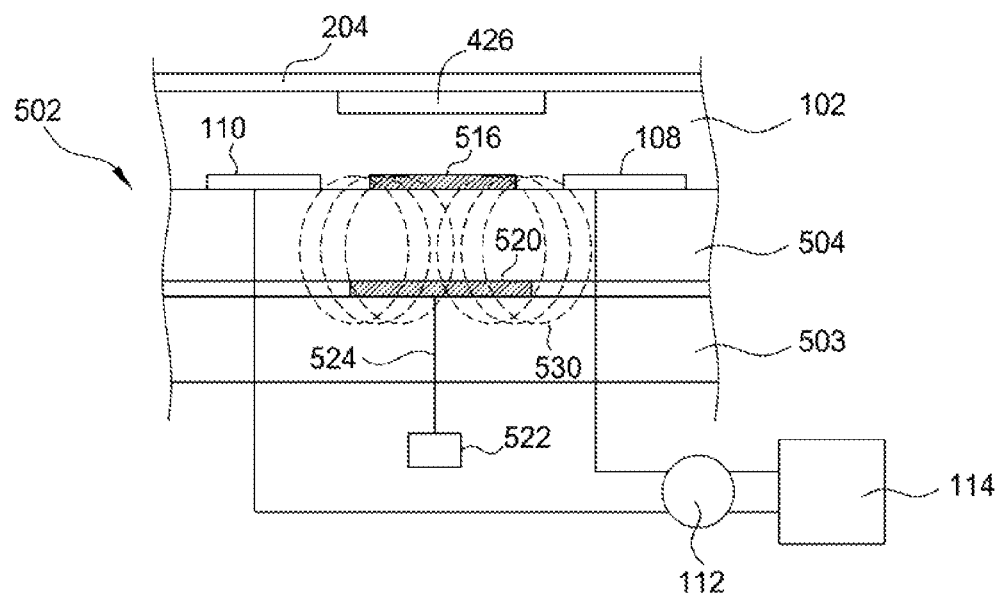
FIG. 5 depicts a schematic partial cross-sectional view of a substrate support assembly using inductive heating elements according to another embodiment of the disclosure.

FIG. 5 depicts a schematic partial cross-sectional view of a substrate support assembly 500 using inductive heating elements according to another embodiment of the disclosure. The substrate support assembly 500 may function in substantially the similar way as discussed above with respect to the substrate support assembly 200 depicted in FIG. 2A, except that the heating elements 516 (only one is shown) are configured as inductive heating elements. The heating elements 516 are inductively coupled to an inductive driver 520, such as an antenna disposed on a supporting pedestal 503. The heating elements 516 can be heated by an induced current generated by corresponding inductive driver 520. The heating elements may be fabricated by a metallic material and may be disposed on the same side as the first and second electrodes 108, 110 in the form of discrete elements as discussed above.

In one embodiment, the heating elements 516 are disposed in the same layer as the first and second electrodes 108, 110. Alternatively, the heating elements 516 may be formed in a different layer than the first and second electrodes 108, 110. For example, the heating elements 516 may be embedded in a first layer within the insulating base 504. The first layer is laminated to a second layer having first and second electrodes 108, 110 therein. The heating elements 516 may also be formed on the backside surface of the insulating base 504 (without interfering the inductive driver 520), in a similar way as discussed above with respect to FIGS. 4B-4C. The inductive driver 520 may be an electromagnetic coil or the like, and may be formed on or within the supporting pedestal 503, i.e., the side of the insulating base 504 opposing the first and second electrodes 108, 110.

In operation, the inductive driver 520 is powered by an external power source 522 via a line 524, for example, an alternating current (AC) power source. When the alternating current flows through the inductive driver 520, the magnetic field 530 of the inductive driver 520 induces an eddy current in the corresponding heating element 516 which causes the heating element 516 to become hot, thereby heating a discrete area of the electrostatic chuck 502. As each group of one or more heating elements 516 are independently controlled, the temperature profile of the substrate 204 may be controlled and tuned azimuthally, radially or in any other manner. Heating the electrostatic chuck 502 with inductive heating technique offers advantages over the resistive heating technique since inductive heating avoids the complexity of wiring electrical interconnections through the insulating base 504 required to connect the heating elements 516 to the external power source. In some embodiments, the electrostatic chuck may be heated with resistive and inductive heating approaches to provide a synergic effect.

In the embodiments shown in FIGS. 4A-4C and 5, a plurality of spaced apart cooling grooves 426 may be formed in the top surface of the encapsulating member. For ease of illustrative purposes, the discussion will be made in conjunction with FIG. 4A. It should be appreciated that some elements have been omitted from FIGS. 4B-4C and 5 for clarity. The cooling grooves 426 (only one cooling groove is shown for clarity) are utilized to provide a gas to the backside of the substrate 204 to facilitate uniform heat transfer between the electrostatic chuck 402 and the substrate 204. The cooling grooves 426 may be sized and distributed to circulate coolant (e.g., a cooling gas) via a line 432 from a coolant source 428 for cooling the substrate 204. The cooling grooves 426 can form a pattern of intersecting channels in any configuration comprised of circular grooves, radial grooves, or a combination thereof. Optionally, the backside surface 409 of the insulating base 404 may also have spaced apart grooves 430 therein to circulate coolant via a line 434 from the coolant source 428. The grooves 430 may be placed in close proximity to the heating zones. The grooves 430 can form a pattern for effectively cooling of the substrate support assembly 400. Additionally or alternatively, the spaced apart grooves may be provided in the top surface of the pedestal 403 to enhance cooling of the substrate support assembly 400.

Figure 6:
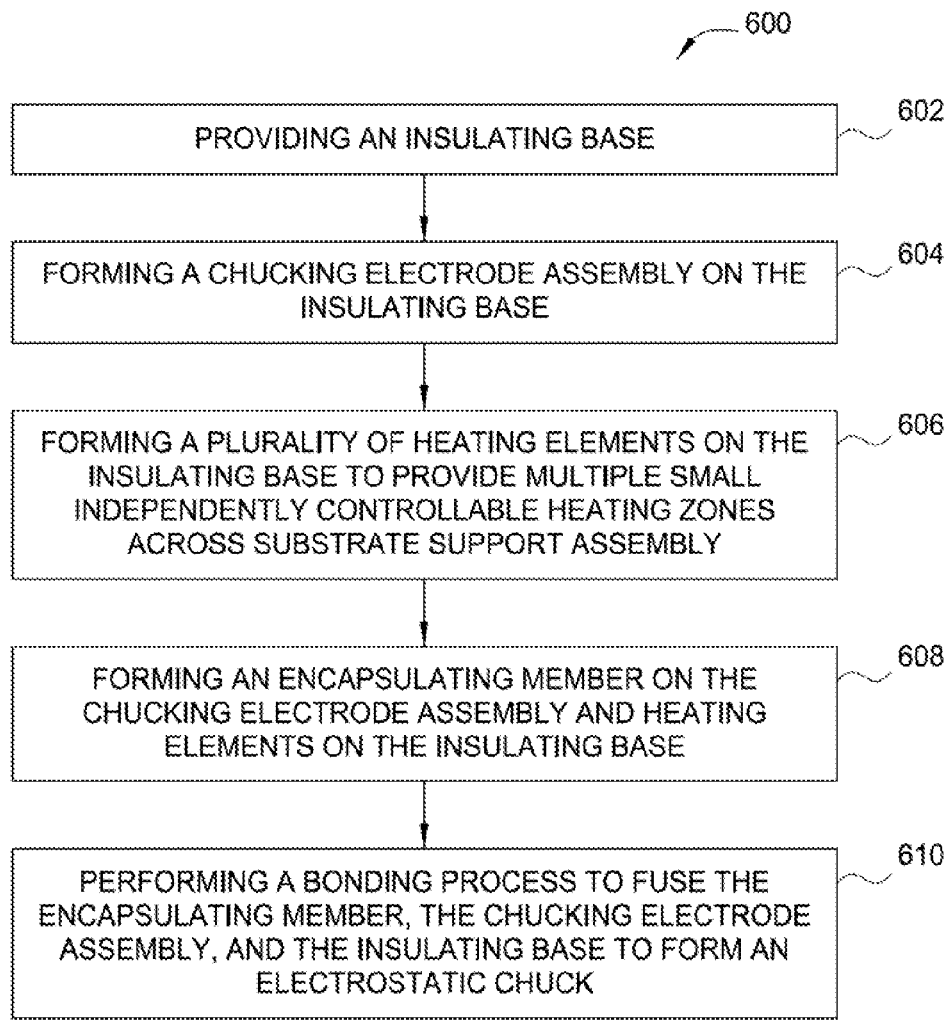
FIG. 6 depicts a flow diagram of a method for manufacturing an electrostatic chuck in accordance with one embodiment of the disclosure.

FIG. 6 depicts a flow diagram of a method for manufacturing an electrostatic chuck in accordance with one embodiment of the disclosure. For illustrative purposes, the following discussion will be made in conjunction with FIG. 4A. It should be appreciated that the method can be similarly adapted or modified to manufacture the electrostatic chucks shown in FIGS. 4B-4C and 5. The method 600 starts at the step 602 by providing an insulating base 404 which has a top surface 407 and a backside surface 409. The top surface 407 of the insulating base 404 is used to receive other components of the electrostatic chuck, such as an encapsulating member 408. The backside surface 409 of the insulating base 404 is adapted to be disposed on a pedestal 403 to form a substrate support assembly 400.

As discussed above, the insulating base 404 may be manufactured from an insulating material to support an electrode assembly 406 subsequently formed thereon. In one embodiment, the insulating base 404 is manufactured from glass, aluminum nitride, aluminum oxide, or ceramic. The insulating base 404 may have a plan area selected to accommodate the size and shape of a substrate to be disposed thereon. In one example, the insulating base 404 may be a circular shape having a diameter between about 4 inches and about 18 inches. Alternatively, the plan area may be polygonal, such as rectangular.

At step 604, an electrode assembly 406 is disposed on the top surface 407 of the insulating base 404. Similar to the electrode assembly 106 described above with referenced to FIGS. 1-2, the electrode assembly 406 may include a first electrode 412 and a second electrode 414 for generating charges with different polarities when powered by a power source 420

In one embodiment, the electrode assembly 406 may be formed by metallic bars, sheet, sticks, foil, and may be pre-molded, pre-casted and pre-manufactured and placed onto the top surface 407 of the insulating base 404 during fabrication of the electrostatic chuck. Alternatively, a metal deposition process may be performed to deposit and form the electrode assembly 406 directly on the top surface 407 of the insulating base 404. Suitable deposition process may include PVD, CVD, plating, ink jet printing, rubber stamping, screen printing or aerosol print process. Additionally, metal paste/metal lines may be formed on the top surface 407 of the insulating base 404. The metal paste/metal lines may initially be a liquid, paste or metal gel that may be patterned on to the object surface in a pattern, such as an array of adjacent rectangles, circles, hexagons, or other similarly shaped features to form electrode fingers with different configurations or dimensions on the top surface 407 of the insulating base 404. As discussed above, the first and the second electrodes 412, 414 may each have a plurality of electrode fingers.

At step 606, a plurality of heating elements 416 is disposed on the insulating base 404 to provide multiple small, independently controllable heating zones across the substrate support assembly 400. In one embodiment, the heating elements 416 are formed on the top surface 407 of the insulating base 404 and are coplanar with the first and second electrodes 412, 414. The heating elements 416 may be disposed in the same layer as the first and second electrodes 412, 414. Alternatively, the interleaved first and second electrodes 412, 414 may be formed in a first layer laminated to a second layer having the heating elements as shown in FIG. 4B. In one another embodiment, the heating elements 416 may be formed on the backside surface of the insulating base 404 as shown in FIG. 4C. In yet another embodiment, the heating elements may be inductive heating elements formed on or within the insulating base, as shown in FIG. 5.

The heating elements 416 may be in the form of discrete metal lines or spaces running along the top surface 407 of the insulating base 404 that is not occupied by the electrodes 412, 414. In one example, the heating elements 416 are formed within a space defined between the first and second electrodes 412, 414. In cases where the electrodes 412, 414 are formed in a pattern shown in FIGS. 1B-1E, the heating elements 416 are distributed over the spaces not covered by the electrodes in a manner to provide multiple independently controllable heating zones across the substrate support assembly.

The heating elements 416 may be formed using a technique similar to those making the electrodes 412, 414 as discussed in step 604. For example, the heating elements 416 may be formed using a metal deposition process such as a screen printing process. The heating elements 416 may be connected to an external power source 211 through an electrical interconnection 418 that may be pre-formed in the insulating base 404. Alternatively, the electrical interconnection may not be required if inductive heating elements are used. In one example, the heating elements 416 is formed on the scale of about 0.1 mm to about 30 mm in width, and about 0.1 mm to about 30 in length. In one embodiment, there may be about 80 to about 200 heating elements on the top surface 407 of the insulating base 404. The number, size, and pattern of the heating elements 416 may vary depending upon the amount of force needed to hold gas pressure (about 1-20 Torr) exerted onto the backside of the substrate in the non-chucking areas (for heat exchange purposes), and the surface area that is occupied by the electrodes 412, 414 for achieving required electrostatic force in the chucking areas (when the heating elements and electrodes are in the same layer).

At step 608, an encapsulating member 408 is disposed on the electrode assembly 406 and the heating elements 416 present on the insulating base 404, as shown in FIG. 4A. The encapsulating member 408 may only cover the electrode assembly if the heating elements are present in a different layer than the electrode assembly, as discussed above with respect to FIGS. 4B-4C and 5. The encapsulating member 408 may be a ceramic material or a glass material. The encapsulating member 408 may be formed on the electrode assembly 406 by a chemical vapor deposition (CVD) process, PECVD process, a spin coating process, a flame coating process, aerosol deposition process, physical vapor deposition (PVD) process, immersion coating, sputtering, thermal spraying coating (e.g., plasma spraying coating), non-plasma, non-thermal assisted coating, hot isostatic pressing, cold isostatic pressing, lamination, compression molding, casting, compacting, sintering or co-sintering techniques or any suitable process to form a ceramic material or a glass material on the electrode assembly 406. In one embodiment, the ceramic material selected to fabricate the encapsulating member 408 is at least one of silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). The encapsulating member 408 may have a thickness between about 0.05 mm and about 2 mm.

In one embodiment, the encapsulating member 408 may have a coefficient of thermal expansion between about 4 and about 8 um/(m*K). The encapsulating member 408 may have an enhanced heat resistance and a melting point greater than 1000 degrees Celsius. The encapsulating member 408 may have a hardness (Vickers 1 Kgf) between about 10 GPa and about 30 GPa, a surface roughness between about 6 μ-inch and 1 μ-inch, such as about 4 μ-inch, and water absorbency of about less than 1 percent or less At step 610, a bonding process is performed to fuse both the encapsulating member 408 and the insulating base 404 together as a whole, with the electrode assembly 106 and heating elements 416 sandwiched therebetween, thereby forming an integral component, of the electrostatic chuck 402 as shown in FIG. 4A.

It is noted that different types of bonding processes may be utilized, such as, but not limited to annealing, sintering, adhering, slumping or diffusion bonding. In one example, the bonding process at step 610 is an annealing process. The annealing process may be performed by any suitable curing or annealing tool, such as oven, furnace, thermal plate, rapid thermal processing (RTP) chamber, spike anneal, or laser annealing chamber, and the like. The annealing process may be performed at a temperature between about 1200 degrees Celsius and about 2500 degree Celsius to assist the consolidation of the encapsulating member 408, the electrode assembly 406 and the insulating base 404 to form into an integral part.

Thus, a substrate support assembly with an electrostatic chuck having multiple zones of temperature control ability is provided. A plurality of heating elements may be formed on the insulating base and are coplanar with the chucking electrodes. Alternatively, the heating elements may be formed in a first layer laminated to a second layer having the chucking electrodes therein. The heating elements may be arranged in the form of discrete sections running along surface area that is not covered by the chucking electrodes to provide multiple heating zones across the surface of the electrostatic chuck. Having the heating elements and the chucking electrodes formed in the same layer (or two adjacent layers laminated together) is advantageous since the thickness of the electrostatic chuck can be reduced and formed as an integrated component with low mass. The low mass enables rapid heating and cooling of the substrate support assembly.

While the foregoing is directed to embodiments of the present disclosure, other and further embodiments of the disclosure may be devised without departing from the basic scope thereof, and the scope thereof is determined by the claims that follow.

What is claimed is:

1. An electrostatic chuck, comprising:
   an insulating base;
   a dielectric layer disposed on the insulating base, the dielectric layer having a substrate supporting surface;
   an electrode assembly disposed between the insulating base and the substrate supporting surface; and
   a plurality of heating elements coupled to the insulating base, wherein the plurality of heating elements are formed on a backside surface of the insulating base, and the heating elements are arranged in independently controllable groups of at least one or more heating elements to azimuthally control a temperature profile across a substrate surface.

2. The electrostatic chuck of claim 1, wherein the plurality of heating elements are arranged in a grid-like configuration, a pixel-like configuration, a dot-like configuration, a polar array configuration, or a concentric configuration.

3. The electrostatic chuck of claim 1, wherein the plurality of heating elements are in the form of discrete metal sections.

4. The electrostatic chuck of claim 1, wherein the plurality of heating elements comprises resistive heating elements.

5. The electrostatic chuck of claim 1, wherein the electrode assembly has at least two interleaving electrodes.

6. The electrostatic chuck of claim 5, wherein the at least two interleaving electrodes comprises a first set of electrode fingers and a second set of electrode fingers, wherein the first set of electrode fingers generate charges with a polarity that is different from the second set of electrode fingers.

7. The electrostatic chuck of claim 1, wherein the plurality of heating elements comprises about 40 to about 300 heating elements.

8. The electrostatic chuck of claim 1, wherein the dielectric layer is fabricated from a glass material or a ceramic material selected from a group consisting of silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN).

9. An electrostatic chuck, comprising:
   an insulating base having a first surface and a second surface opposing the first surface;
   an electrode assembly formed on the first surface of the insulating base, the electrode assembly having a first electrode interleaved with a second electrode;
   a plurality of heating elements formed between interleaved portions of the first and second electrodes, wherein the plurality of heating elements are formed on the second surface of the insulating base; and
   an encapsulating member coupled to the electrode assembly.

10. The electrostatic chuck of claim 9, wherein the plurality of heating elements are in the form of discrete sections.

11. The electrostatic chuck of claim 9, wherein the plurality of heating elements comprises resistive heating elements.

12. The electrostatic chuck of claim 9, wherein the encapsulating member is fabricated from a glass material or a ceramic material selected from a group consisting of silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN).

13. A method for fabricating an electrostatic chuck, comprising:
   forming an electrode assembly on an insulating base, wherein the electrode assembly includes a first electrode interleaved with a second electrode;
   forming a plurality of heating elements on a backside of the insulating base, wherein the heating elements azimuthally control a temperature profile across a substrate surface; and
   forming an encapsulating member on the electrode assembly.

14. The method of claim 13, further comprising:
   bonding the insulating base to the encapsulating member to form an integral component.

15. The electrostatic chuck of claim 1, wherein the plurality of heating elements comprises inductive heating elements.

16. The electrostatic chuck of claim 9, wherein the plurality of heating elements comprises inductive heating elements.

* * * * *